(12) United States Patent
Müssig

(10) Patent No.: US 7,060,600 B2
(45) Date of Patent: Jun. 13, 2006

(54) SEMICONDUCTOR CAPACITOR AND MOSFET FITTED THEREWITH

(75) Inventor: Hans-Joachim Müssig, Dresden (DE)

(73) Assignee: IHP GmbH - Innovations for High Performance Microelectronics/Instut fur Innovative Mikroelektronik, Frankfurt (DE)

(*) Notice: Subject to any disclaimer, the term of this patent is extended or adjusted under 35 U.S.C. 154(b) by 0 days.

(21) Appl. No.: 10/520,396

(22) PCT Filed: Jul. 4, 2003

(86) PCT No.: PCT/EP03/07179

§ 371 (c)(1),
(2), (4) Date: Mar. 17, 2005

(87) PCT Pub. No.: WO2004/006315

PCT Pub. Date: Jan. 15, 2004

(65) Prior Publication Data

US 2005/0212030 A1     Sep. 29, 2005

(30) Foreign Application Priority Data

Jul. 4, 2002   (DE) ................ 102 30 674

(51) Int. Cl.
*H01L 21/28* (2006.01)

(52) U.S. Cl. ................................. 438/583

(58) Field of Classification Search .......... 438/656, 438/287, 161, 583; 257/412
See application file for complete search history.

(56) References Cited

U.S. PATENT DOCUMENTS

| | | | |
|---|---|---|---|
| 5,356,833 A * | 10/1994 | Maniar et al. ............. 438/656 |
| 5,753,541 A * | 5/1998 | Shimizu .................... 438/161 |
| 6,656,852 B1 | 12/2003 | Rotondaro et al. | |
| 2002/0036313 A1 | 3/2002 | Yang et al. | |
| 2003/0119291 A1 | 6/2003 | Ahn | |
| 2003/0193061 A1 | 10/2003 | Osten | |
| 2003/0228747 A1 | 12/2003 | Ahn et al. | |
| 2005/0145959 A1* | 7/2005 | Forbes et al. ............... 257/412 |

FOREIGN PATENT DOCUMENTS

WO     WO 02/097895     12/2002

OTHER PUBLICATIONS

Surface Science 504 (2002) 159-166, XP-001189099, Initial stages of praseodymium oxide film formation on Si(001), H.-J. Müssig et al., IHP, Im Technologiepark 25, D-15236 Frankfurt (Oder), Germany; received Sep. 8, 2001, accepted for publication Dec. 3, 2001.

2001 IRW Final Report, 0-7803-7167-Apr. 1, 2001 IEEE, Can Praseodymium Oxide be an Alternative High-K Gate Dielectric Material for Silicon Integrated Circuits?, H. -J Müssig et al., IHP, Im Technologiepark 25, D-15236 Frankfurt (Oder), Germany.

* cited by examiner

Primary Examiner—Carl Whitehead, Jr.
Assistant Examiner—Monica D. Harrison
(74) Attorney, Agent, or Firm—Ware, Fressola, Van Der Sluys & Adolphson LLP

(57) ABSTRACT

In accordance with the invention the semiconductor capacitor includes a first capacitor electrode 1, a second capacitor electrode 3 and a capacitor dielectric 5 which is arranged between the two capacitor electrodes and which includes praseodymium oxide. It is distinguished in that the second capacitor electrode 3 includes praseodymium silicide.

15 Claims, 1 Drawing Sheet

SEMICONDUCTOR CAPACITOR AND MOSFET FITTED THEREWITH

CROSS REFERENCE TO RELATED APPLICATIONS

This application is a continuation of International Application PCT/EP03/07179 having an international filing date of 4 Jul. 2003 and from which priority is claimed under all applicable sections of Title 35 of the United States Code including, but not limited to, Sections 120, 363 and 365(c).

TECHNICAL FIELD

Background Art

The invention concerns a semiconductor capacitor comprising a capacitor dielectric which is arranged between a first capacitor electrode and a second capacitor electrode and which includes praseodymium oxide, as well as an MOSFET constructed with a such a semiconductor capacitor. The invention further concerns a process for the production of a praseodymium silicide layer on a praseodymium oxide layer.

DISCLOSURE OF THE INVENTION

It is no longer possible to imagine modern semiconductor technology without semiconductor capacitors. Important examples of use of semiconductor capacitors are dynamic random access memories (DRAM) in which the semiconductor capacitors are used as memory cells and metal oxide semiconductor field effect transistors (MOSFETs) in which the substrate, the gate electrode and the gate oxide between the substrate and the gate electrode form a semiconductor capacitor.

Like all capacitors, it holds good for a semiconductor capacitor that the capacitance of the capacitor is proportional to the dielectric constant of the dielectric between the capacitor electrodes and the area of the capacitor electrodes as well as to the reciprocal value of the spacing between the capacitor electrodes, that is to say the thickness of the dielectric. Silicon oxide ($SiO_2$) is frequently used as the dielectric in the semiconductor art.

With the increasing reduction in component size in the semiconductor art, the dimensions of the capacitor plates of semiconductor capacitors, for example the gate electrodes of MOSFETs, are also progressively decreasing. This means however that the capacitance of the semiconductor capacitor is also reduced unless measures are taken to counteract that.

There are two possible ways of compensating for the reduction in the dimensions of the capacitor electrodes. The first option involves reducing the thickness of the dielectric. For example in MOSFETs in which silicon oxide is typically used as the dielectric, that gives rise to problems, with gate lengths of less than 0.1 µm. The silicon oxide for components with such short gate lengths would then have to be thinner than 1.5 nm. Such a thin silicon oxide however results in an increase in the leakage current of the MOSFET. The leakage current occurs by virtue of electrons which tunnel through the thin gate oxide between the substrate and the gate electrode. The number of tunneling electrodes and thus the strength of the leakage current increases exponentially with a progressively decreasing thickness of the silicon oxide layer. It is however desirable to minimize the leakage current of an MOSFET as the aim is to consume as little electrical power as possible for controlling the current between the drain electrode and the source electrode.

A further possible way of compensating for the reduction in dimensions of the capacitor electrodes involves altering the dielectric constant of the dielectric. If praseodymium oxide ($Pr_2O_3$) is used as the dielectric instead of silicon oxide, the capacitance of the capacitor can be markedly increased, with the parameters involved being otherwise the same, by virtue of the praseodymium oxide having a higher dielectric constant than silicon oxide. Silicon oxide has a dielectric constant of 3.9 whereas praseodymium oxide has a dielectric constant of 30. This means that, with praseodymium oxide as the dielectric, the gate oxide can be thicker than a dielectric of silicon oxide by the factor of 30 divided by 3.9. Therefore, with praseodymium oxide as the gate dielectric, the leakage current can be drastically reduced in comparison with silicon oxide as the dielectric.

The capacitor dielectric including praseodymium oxide is adjoined by a capacitor electrode which usually includes silicon. That in turn is electrically contacted by way of a metal silicide layer. In addition, also disposed between the capacitor dielectric and the capacitor electrode is an intermediate layer for suppressing chemical reactions between the material of the capacitor dielectric and that of the capacitor electrode.

The object of the invention is to provide a semiconductor capacitor with praseodymium oxide as the capacitor dielectric as well as an MOSFET constructed with such a semiconductor capacitor, which is of a simpler structure in comparison with the state of the art.

That object is attained by a semiconductor capacitor according to the invention, an MOSFET according to the invention, and a process for the production of a praseodymium silicide layer on a praseodymium oxide layer according to the invention.

In accordance with the invention the semiconductor capacitor includes a first capacitor electrode, a second capacitor electrode and a capacitor dielectric which is arranged between the two capacitor electrodes and which includes praseodymium oxide. It is distinguished in that the second capacitor electrode includes praseodymium silicide.

In accordance with the invention the second capacitor electrode includes praseodymium silicide at least in the boundary region with respect to the capacitor dielectric. The advantage of that solution is that both the material of the capacitor dielectric and also the material of the second capacitor electrode contain praseodymium, therefore there is a certain chemical relationship between the two materials. That relationship means that the intermediate layer between the capacitor dielectric and the capacitor electrode is superfluous.

In a further configuration the whole of the second capacitor electrode of the semiconductor capacitor according to the invention completely consists of praseodymium silicide. That configuration does not require any additional contact silicide layer as the praseodymium silicide itself functions as a contact silicide. That configuration therefore permits the semiconductor capacitor to be of a particularly simple structure.

In an embodiment of the semiconductor capacitor which in particular permits use thereof in MOSFETs, the first capacitor electrode includes silicon. In that case the semiconductor substrate of an MOSFET can be used as the first capacitor electrode. The first capacitor electrode may also include a silicon-germanium alloy in order to permit the semiconductor capacitor to be used in MOSFETs with a substrate which includes silicon-germanium.

In accordance with a second aspect of the invention there is provided an MOSFET which includes a semiconductor substrate, a gate dielectric, a gate electrode and a semiconductor capacitor according to the invention. In that case the first capacitor electrode is formed by the semiconductor substrate, the second capacitor electrode by the gate electrode and the capacitor dielectric by the gate dielectric.

In accordance with a third aspect of the invention there is provided a process for the production of a semiconductor capacitor which has a praseodymium oxide-bearing dielectric. The process according to the invention has a step of producing a praseodymium suicide layer on the praseodymium oxide-bearing layer.

In a first embodiment of the process the praseodymium silicide layer is deposited out of the gaseous phase.

In a further embodiment of the invention the praseodymium silicide layer is produced by means of local energy input into regions near the surface of the praseodymium oxide-bearing layer by thermal conversion of praseodymium oxide. In that case local energy input is preferably effected by means of a laser.

In accordance with a further aspect of the invention there is provided a process for the production of a praseodymium silicide layer on a praseodymium oxide-bearing layer. According to the invention the praseodymium silicide layer is formed by means of local energy input into regions near the surface of the praseodymium oxide-bearing layer by thermal conversion of praseodymium oxide. Preferably the praseodymium oxide-bearing layer is of praseodymium oxide, at least in its regions which are near the surface. The process according to the fourth aspect of the invention has the advantage that a specific deposition step for the production of the praseodymium silicide layer is eliminated. The process is preferably used in conjunction with the production of a semiconductor capacitor according to the invention, or an MOSFET according to the invention.

The local energy input can be effected for example by means of a laser. The laser radiation used for the conversion procedure can be so adjusted in respect of wavelength and intensity, if necessary also by means of an additional focusing device, that specific targeted conversion only of regions of the praseodymium oxide layer, which are near the surface, into a praseodymium silicide layer, occurs.

DETAILED DESCRIPTION OF THE INVENTION

Further advantageous features and properties of the semiconductor capacitor according to the invention and the MOSFET according to the invention and the process according to the invention are described hereinafter by means of embodiments by way of example with reference to the accompanying drawings in which:

BRIEF DESCRIPTION OF THE DRAWINGS

FIG. 1 shows a portion of the layer sequence of a semiconductor capacitor according to the invention. The semiconductor capacitor includes a first capacitor electrode which in the present case is in the form of a semiconductor region 1 in a silicon substrate, and a praseodymium silicide layer 3 as the second capacitor electrode. Disposed between the first and second capacitor electrodes is a layer 5 of praseodymium oxide ($Pr_2O_3$) as the capacitor dielectric. A semiconductor capacitor of that kind can serve for example as a memory capacitor of a dynamic random access memory (DRAM) or as a gate capacitor in an MOSFET.

Figure 1:
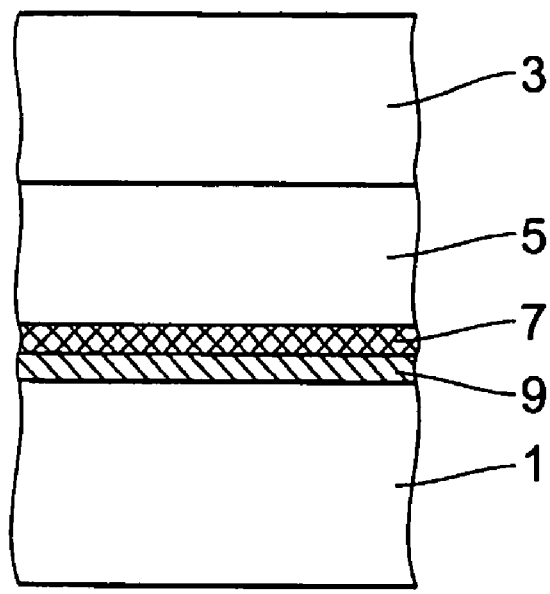
FIG. 1 shows a portion of a first embodiment of the semiconductor capacitor according to the invention, and FIG. 2 diagrammatically shows an MOSFET according to the invention.

The praseodymium suicide layer 3 can be produced in the procedure for the production of the semiconductor capacitor for example by layer deposition out of the gaseous phase (CVD, chemical vapor deposition) onto the praseodymium oxide 5 of the capacitor dielectric. Depending on the deposition conditions when producing the praseodymium silicide layer 3 there are no or only slight reactions between the praseodymium oxide and the praseodymium silicide so that the result is no or only a very thin interface layer. An intermediate layer between the capacitor dielectric and the capacitor electrode for suppressing chemical reactions is therefore redundant.

The praseodymium silicide layer 3 on the praseodymium oxide layer 5 can alternatively be produced by a procedure whereby the praseodymium oxide is thermally converted by local energy input (for example by means of irradiation with laser light) into the region, near the surface, of the side remote from the substrate.

If the semiconductor region 1 comprises silicon (Si), a mixed oxide layer 7 of the form $(PrO_2)_x(SiO_2)_{1-x}$, which originates from the production process, can be present at the boundary surface of the gate dielectric 5, which is towards the first semiconductor region 1, in which case x can assume values in the range of greater than zero and less than one. Therefore, it is possible to provide between the mixed oxide 7 and the semiconductor region 1 a thin oxynitride layer 9 which serves as a diffusion barrier for oxygen and which prevents oxygen from reaching the silicon surface of the semiconductor region 1 through the praseodymium oxide 5 during heat treatment steps which follow deposition of the praseodymium oxide layer 5 on the semiconductor region 1, and oxidizing the silicon surface of the semiconductor region 1. The oxynitride layer 9 is produced in the production process prior to the step of depositing the praseodymium oxide layer 5, the presence thereof is not necessary for the present invention but it is advantageous.

Figure 2:
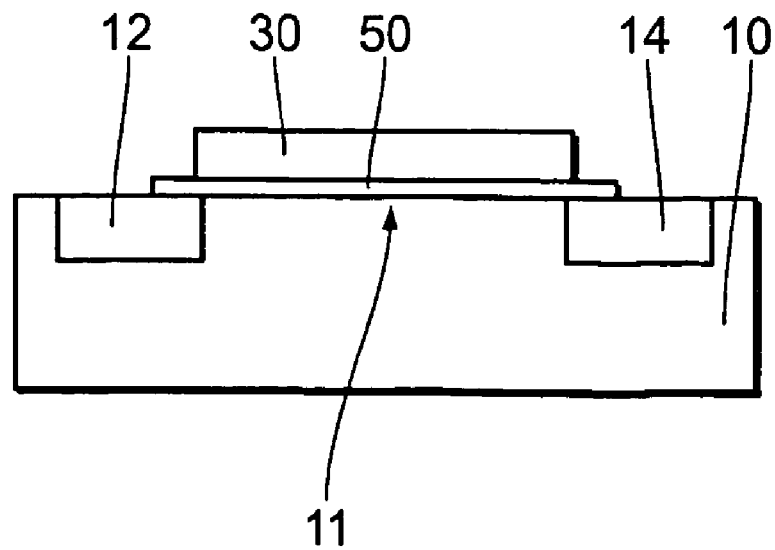

An embodiment of the MOSFET according to the invention is shown in FIG. 2. It includes an n-doped silicon substrate 10 in which the channel region 11 of the MOSFET is formed and which represents the first capacitor electrode. In addition, present in the semiconductor substrate are a p-doped source region 12 and a p-doped drain region 14. Disposed over the channel region 11 of the MOSFET is a gate electrode 30 which represents the second capacitor electrode and which is separated from the substrate 10 by a praseodymium oxide-bearing gate dielectric 50 representing the capacitor dielectric. The gate electrode 30 consists entirely of praseodymium silicide.

Instead of a silicon substrate, the MOSFET can also have a semiconductor substrate which includes a silicon-germanium alloy. Alternatively however the semiconductor substrate can also consist completely of the silicon-germanium alloy.

Admittedly in the present embodiment the semiconductor substrate 10 is n-doped and the drain region 14 as well as the source region 12 are each p-doped, but the dopings can also be reversed. In that case the semiconductor substrate 10 is then p-doped and the drain region 14 and the source region 12 are each n-doped.

What is claimed is:

1. A semiconductor capacitor including a first capacitor electrode (1; 10), a second capacitor electrode (3; 30) and a capacitor dielectric (5; 50) which is arranged between the two capacitor electrodes (1, 3; 10, 30) and which includes praseodymium oxide, characterized in that the second capacitor electrode (3; 30) contains praseodymium silicide at least in the boundary region in relation to the capacitor dielectric.

2. A semiconductor capacitor as set forth in claim 1 characterized in that the second capacitor electrode (3; 30) consists of praseodymium silicide.

3. A semiconductor capacitor as set forth in claim 1 characterized in that the first capacitor electrode (1; 10) includes silicon.

4. A semiconductor capacitor as set forth in claim 3 characterized in that a mixed oxide layer (7) in the form of $(PrO_2)_x(SiO_2)_{1-x}$ is present between the capacitor dielectric and the first capacitor electrode, wherein x can assume values in the range of greater than zero and less than one.

5. A semiconductor capacitor as set forth in claim 1 characterized in that the first capacitor electrode (1; 10) includes a silicon-germanium alloy.

6. A semiconductor capacitor as set forth in claim 5 characterized in that a mixed oxide layer (7) in the form of $(PrO_2)_x(SiO_2)_{1-x}$ is present between the capacitor dielectric and the first capacitor electrode, wherein x can assume values in the range of greater than zero and less than one.

7. A semiconductor capacitor as set forth in claim 6 wherein there is provided an oxynitride layer (9) between the mixed oxide layer and the first semiconductor region.

8. An MOSFET comprising a semiconductor substrate (10), a gate dielectric (50), a gate electrode (30) and a semiconductor capacitor as set forth in one of the preceding claims, wherein the first capacitor electrode is formed by the semiconductor substrate (10), the second capacitor electrode by the gate electrode (30) and the capacitor dielectric by the gate dielectric (50).

9. A semiconductor capacitor as set forth in claim 1 characterized in that the first capacitor electrode (1; 10) includes silicon.

10. A semiconductor capacitor as set forth in claim 1 characterized in that the first capacitor electrode (1; 10) includes a silicon-germanium alloy.

11. A process for the production of a semiconductor capacitor which has a praseodymium oxide-bearing dielectric, characterized by a step of producing a praseodymium silicide layer on the praseodymium oxide-bearing layer.

12. A process as set forth in claim 11 wherein the praseodymium silicide layer is deposited out of the gaseous phase.

13. A process as set forth in claim 11 wherein the praseodymium silicide layer is produced by thermal conversion of praseodymium oxide by means of local energy input into regions near the surface of the praseodymium oxide-bearing layer.

14. A process as set forth in claim 13 wherein the local energy input is effected by means of a laser.

15. A process for the production of a praseodymium silicide layer on a praseodymium oxide-bearing layer wherein the praseodymium silicide layer is produced by thermal conversion of praseodymium oxide by means of local energy input into regions near the surface of the praseodymium oxide-bearing layer.

* * * * *